(12) United States Patent
Lee

(10) Patent No.: US 11,916,277 B2
(45) Date of Patent: Feb. 27, 2024

(54) ELECTRONIC DEVICE AND ANTENNA ASSEMBLY

(71) Applicant: GETAC HOLDINGS CORPORATION, Taoyuan (TW)

(72) Inventor: Kun-Cheng Lee, Taipei (TW)

(73) Assignee: GETAC HOLDINGS CORPORATION, Taoyuan (TW)

( * ) Notice: Subject to any disclaimer, the term of this patent is extended or adjusted under 35 U.S.C. 154(b) by 373 days.

(21) Appl. No.: 17/357,519

(22) Filed: Jun. 24, 2021

(65) Prior Publication Data

US 2021/0408659 A1 Dec. 30, 2021

Related U.S. Application Data

(60) Provisional application No. 63/044,206, filed on Jun. 25, 2020.

(30) Foreign Application Priority Data

Nov. 13, 2020 (CN) .......................... 202011268964.6

(51) Int. Cl.
*H01Q 1/02* (2006.01)
*H01Q 1/24* (2006.01)
*H01Q 13/18* (2006.01)
*H04M 1/02* (2006.01)
*H04M 1/18* (2006.01)
*H05K 5/06* (2006.01)

(52) U.S. Cl.
CPC ............... *H01Q 1/02* (2013.01); *H01Q 1/243* (2013.01); *H01Q 13/18* (2013.01); *H04M 1/0274* (2013.01); *H04M 1/18* (2013.01); *H05K 5/06* (2013.01)

(58) Field of Classification Search
CPC .......... H01Q 1/02; H01Q 1/243; H01Q 13/18; H01Q 13/10; H04M 1/0274; H04M 1/18; H05K 5/06; G06F 1/1616; G06F 1/1656; G06F 1/1698; G06F 1/189; G06F 1/203
See application file for complete search history.

(56) References Cited

U.S. PATENT DOCUMENTS

2007/0176831 A1* 8/2007 Lagnado ............... G06F 1/1698
  343/702
2009/0303151 A1* 12/2009 Tai .......................... H01Q 1/38
  343/878

(Continued)

*Primary Examiner* — Hai V Tran
*Assistant Examiner* — Michael M Bouizza
(74) *Attorney, Agent, or Firm* — Cooper Legal Group, LLC

(57) ABSTRACT

An electronic device includes a casing and an antenna assembly. The casing has a waterproof area and a peripheral area. The peripheral area is defined at the periphery of the waterproof area. The antenna assembly is disposed at the peripheral area. The antenna assembly includes a hollow-core housing, a circuit board, an antenna, a first sealing element and a second sealing element. The hollow-core housing has a receiving recess and two openings. The two openings are in communication with two opposing ends of the receiving recess. The circuit board is disposed in the receiving recess. The antenna is disposed in the receiving recess and electrically connected to the circuit board. The first sealing element has a wiring aperture. The first sealing element and the second sealing element hermetically seal the two openings of the hollow-core housing, respectively.

20 Claims, 15 Drawing Sheets

(56) References Cited

U.S. PATENT DOCUMENTS

| | | | | |
|---|---|---|---|---|
| 2011/0164365 A1* | 7/2011 | McClure | ............... | H01H 13/10 |
| | | | | 361/679.55 |
| 2014/0171159 A1* | 6/2014 | Endo | ..................... | H01Q 1/243 |
| | | | | 343/904 |
| 2014/0361933 A1* | 12/2014 | Zhang | ................... | H01Q 1/243 |
| | | | | 343/702 |
| 2017/0365911 A1* | 12/2017 | Zachara | ................ | H01Q 21/28 |
| 2019/0072903 A1* | 3/2019 | Park | ...................... | G04B 37/08 |
| 2020/0093018 A1* | 3/2020 | Chou | .................... | H05K 5/061 |
| 2020/0329549 A1* | 10/2020 | Seo | ..................... | H01Q 1/2283 |

\* cited by examiner

ELECTRONIC DEVICE AND ANTENNA ASSEMBLY

CROSS-REFERENCE TO RELATED APPLICATIONS

The present application claims the benefit of U.S. Provisional Patent Application No. 63/044,206, filed on Jun. 25, 2020, the disclosure of which is hereby incorporated by reference herein in its entirety. The present application further claims priority to a CN Patent Application No. 202011268964.6, filed on Nov. 13, 2020, the disclosure of which is also hereby incorporated by reference herein in its entirety.

BACKGROUND OF THE INVENTION

Field of the Invention

The present disclosure relates to electronic devices and antenna assemblies and, more particularly, to an electronic device and an antenna assembly having an antenna contained in a hollow-core housing hermetically sealed with a sealing element.

Description of the Prior Art

At present, electronic devices mostly come with fourth-generation (4G) mobile communication technology antennas. 4G antennas do not need power supply and thus have little waterproofing requirement; hence, 4G antennas may be disposed at slightly-waterproof peripheral areas of casings of electronic devices to maintain efficiency of receiving and sending antenna signal. Owing to advance of communication technology, fourth-generation (4G) mobile communication technology has evolved into fifth-generation (5G) mobile communication technology. 5G has advantages as follows: high data transmission speed, reduced delay, power saving, low cost, increased system capacity, and large-scale device connection. Therefore, 5G is inevitably a technology to be applied to electronic devices in the foreseeable future.

However, 5G antennas need power supply; hence, compared with 4G antennas, 5G antennas have high waterproofing requirement and satisfactory efficiency of receiving and sending antenna signals. However, 5G antennas cannot be disposed within waterproof areas surrounded by metal plates of electronic devices, otherwise signal shielding will occur. Therefore, there is difficulty in applying 5G antennas to electronic devices.

SUMMARY OF THE INVENTION

The present disclosure provides an electronic device and an antenna assembly to overcome the aforesaid difficulty in applying 5G antennas to electronic devices.

An electronic device provided in an embodiment of the present disclosure comprises a casing and an antenna assembly. The casing has a waterproof area and a peripheral area. The peripheral area is defined at the periphery of the waterproof area. The antenna assembly is disposed at the peripheral area. The antenna assembly comprises a hollow-core housing, a circuit board, an antenna, a first sealing element and a second sealing element. The hollow-core housing has a receiving recess and two openings. The two openings are in communication with two opposing ends of the receiving recess. The circuit board is disposed in the receiving recess. The antenna is disposed in the receiving recess and electrically connected to the circuit board. The first sealing element has a wiring aperture. The first sealing element and the second sealing element hermetically seal the two openings of the hollow-core housing, respectively.

An antenna assembly provided in another embodiment of the present disclosure comprises a hollow-core housing, a circuit board, an antenna, a first sealing element and a second sealing element. The hollow-core housing has a receiving recess and two openings. The two openings are in communication with two opposing ends of the receiving recess. The circuit board is disposed in the receiving recess. The antenna is disposed in the receiving recess and electrically connected to the circuit board. The first sealing element has a wiring aperture. The first sealing element and the second sealing element hermetically seal the two openings of the hollow-core housing, respectively.

Regarding the electronic device and the antenna assembly provided in the aforesaid embodiment, the two opposing openings of the hollow-core housing are hermetically sealed with the first sealing element and the second sealing element, respectively, to prevent intrusion of water and moisture into the receiving recess of the hollow-core housing through the two openings and thus ensure the hermetic seal of the hollow-core housing. Therefore, even though the antenna assembly is disposed at the peripheral area defined at the periphery of the waterproof area of the casing, water and moisture cannot intrude into the hollow-core housing, thereby lowering the chance that the antenna and circuit board in the hollow-core housing will get damaged.

The description above and the description below serve to provide examples and explanations to the principles of the present disclosure and provide further interpretation to the claims of the present disclosure.

DETAILED DESCRIPTION OF THE EMBODIMENTS

Figure 1:
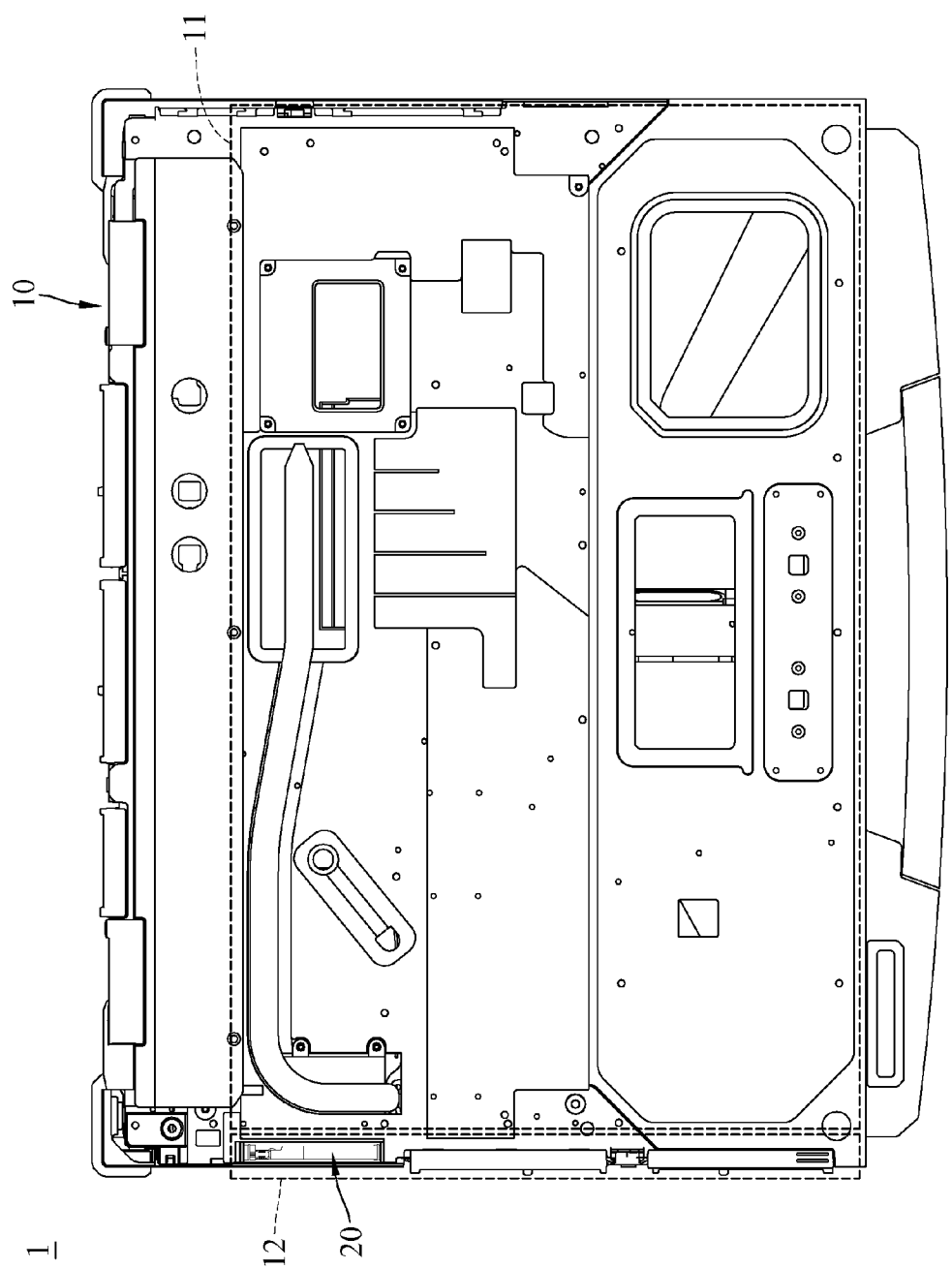
FIG. 1 is a top view of an electronic device according to the first embodiment of the present disclosure.
Figure 2:
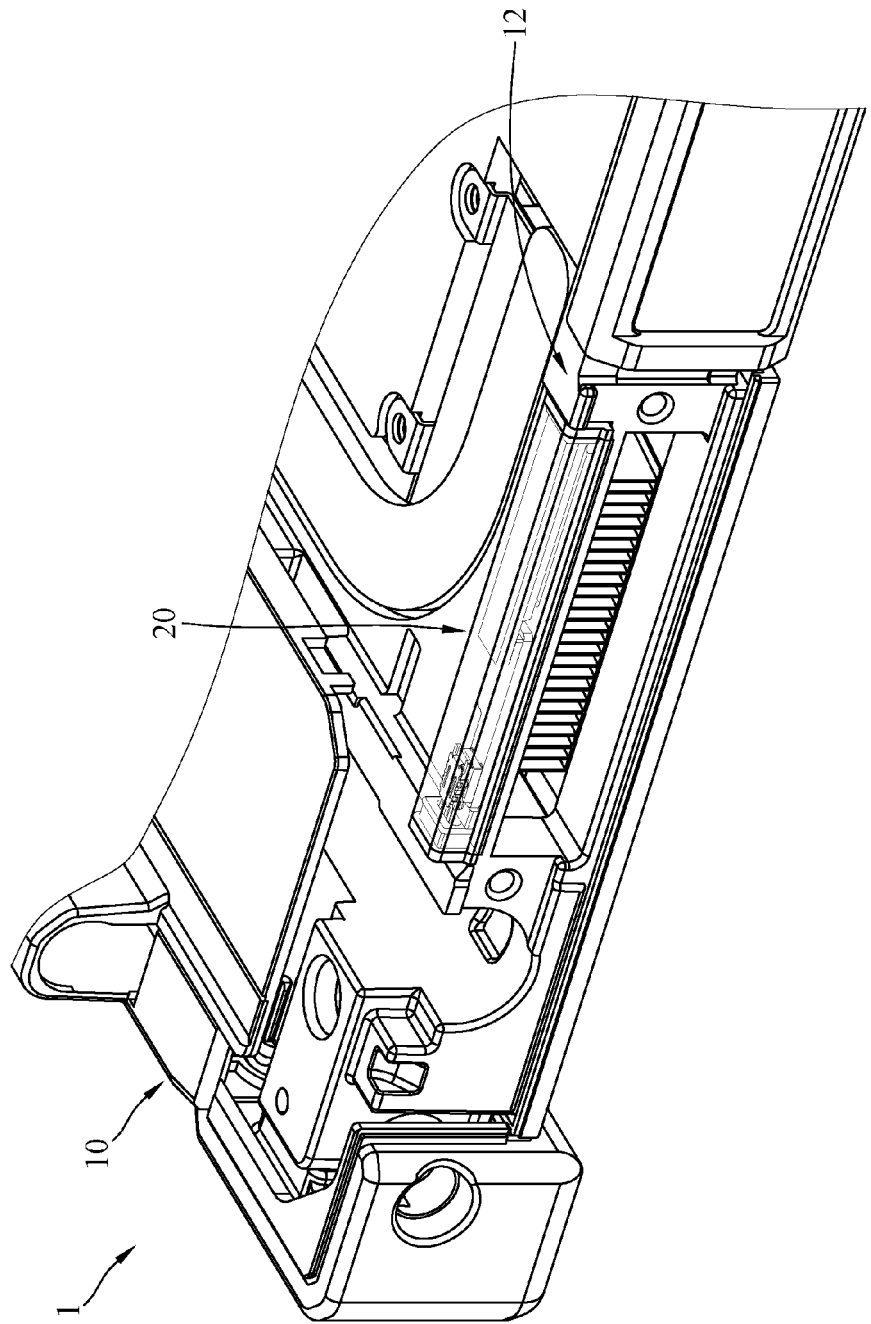
FIG. 2 is a cutaway view based on FIG. 1.
Figure 3:
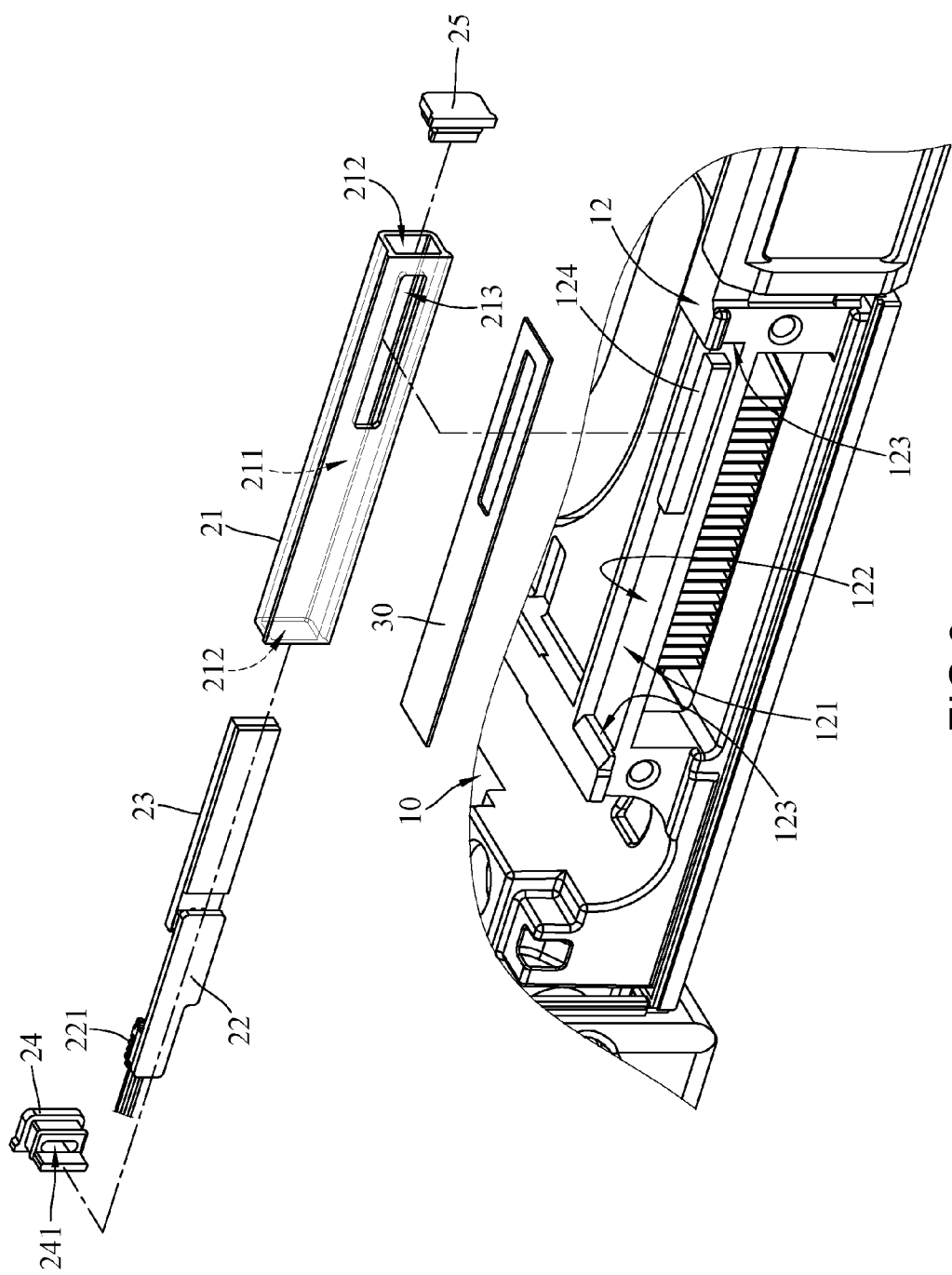
FIG. 3 is an exploded view based on FIG. 2.
Figure 4:
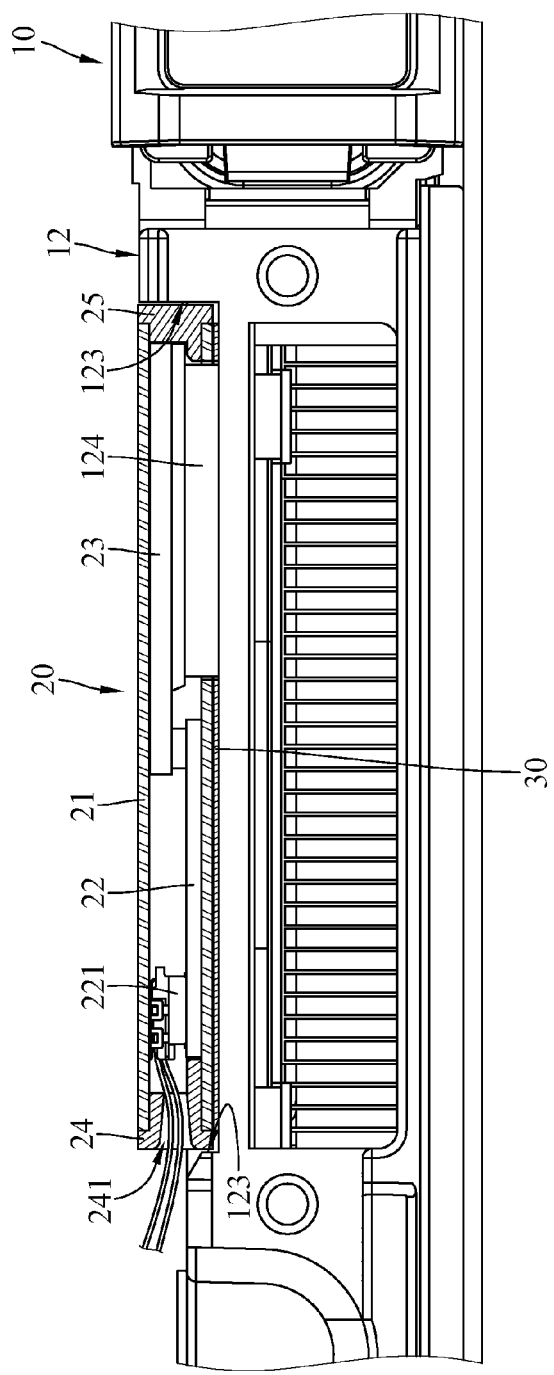
FIG. 4 is a cross-sectional view based on FIG. 2.

Refer to FIG. 1 through FIG. 4. FIG. 1 is a top view of an electronic device according to the first embodiment of the present disclosure. FIG. 2 is a cutaway view based on FIG. 1. FIG. 3 is an exploded view based on FIG. 2. FIG. 4 is a cross-sectional view based on FIG. 2.

In this embodiment, the electronic device 1 is, for example, a rugged laptop or a gaming laptop. An electronic device 1 comprises a casing 10 and an antenna assembly 20. In this embodiment or any other embodiment, the electronic device 1 further comprises an adhering element 30.

The casing 10 is, for example, the housing of the body of a laptop. The casing 10 has a waterproof area 11 and a peripheral area 12. The waterproof area 11 is, for example, surrounded by a metal plate. The peripheral area 12 is defined at the periphery of the waterproof area 11. The peripheral area 12 is enclosed by a plastic coating. Thus, the peripheral area 12 falls outside an area formed by the surrounding metal plate; hence, not only does the peripheral area 12 have worse waterproofing performance than the waterproof area 11, but electronic components in the peripheral area 12 are also less susceptible to signal shielding than electronic components in the waterproof area 11. Therefore, the waterproof area 11 accommodates electronic components which have to shut out water or have to be protected against electromagnetic interference, such as motherboards, whereas the peripheral area 12 accommodates electronic components which either has little waterproofing requirement or has a need to receive and send wireless signals.

In this embodiment, the peripheral area 12 of the casing 10 has a mounting recess 121, a bottom surface 122 and two opposing lateral surfaces 123. The bottom surface 122 and two lateral surfaces 123 jointly form the mounting recess 121. The antenna assembly 20 is mounted in the mounting recess 121. The antenna assembly 20 is fixed to the bottom surface 122 through the adhering element 30. The two lateral surfaces 123 clamp the antenna assembly 20.

The antenna assembly 20 comprises a hollow-core housing 21, a circuit board 22, an antenna 23, a first sealing element 24 and a second sealing element 25.

The hollow-core housing 21 is, for example, made of a transparent material. The hollow-core housing 21 has a receiving recess 211, two openings 212 and a slot 213. The two openings 212 and the slot 213 are in communication with different ends of the receiving recess 211, respectively, and the two openings 212 are opposite each other. The circuit board 22 and the antenna 23 are disposed in the receiving recess 211. The slot 213 exposes the antenna 23. The antenna 23 is electrically connected to the circuit board 22. The first sealing element 24 and second sealing element 25 are, for example, made of rubber. The first sealing element 24 and second sealing element 25 hermetically seal the two openings 212, respectively.

The adhering element 30 is, for example, double-sided tape. The hollow-core housing 21 is fixed to the bottom surface 122 of the casing 10 through the adhering element 30, whereas the adhering element 30, for example, surrounds the slot 213 of the hollow-core housing 21. The two lateral surfaces 123 of the casing 10 press against the first sealing element 24 and second sealing element 25, respectively, to prevent separation of the first sealing element 24 and second sealing element 25 from the hollow-core housing 21. In this embodiment, the casing 10 further has a heat transfer bump 124. The heat transfer bump 124 is, for example, formed by die-based production or formed by computer numerical control (CNC) processing. The heat transfer bump 124 is disposed in the slot 213 of the hollow-core housing 21 and thermally coupled to the antenna 23. Heat generated by the antenna 23 is transferred by the heat transfer bump 124 to the casing 10, such that heat exchange takes place between the casing 10 and the surroundings. Furthermore, with the heat transfer bump 124 being disposed in the slot 213 of the hollow-core housing 21, the antenna assembly 20 is positioned at the peripheral area 12 of the casing 10.

In this embodiment, the circuit board 22 has a power connector 221, whereas the first sealing element 24 has a wiring aperture 241. The wiring aperture 241 is penetrable by a power cable. The power cable is connected to the power connector 221.

In this embodiment, the two opposing openings 212 of the hollow-core housing 21 are hermetically sealed by the first sealing element 24 and the second sealing element 25, respectively, to prevent intrusion of water and moisture into the receiving recess 211 of the hollow-core housing 21 through the two openings 212 and thereby ensure the hermetic seal of the hollow-core housing 21. Therefore, even though the antenna assembly 20 is disposed at the peripheral area 12 defined at the periphery of the waterproof area 11 of the casing 10, water and moisture cannot intrude into the hollow-core housing 21, thereby lowering the chance that the antenna 23 and circuit board 22 in the hollow-core housing 21 will get damaged.

Furthermore, the adhering element 30 surrounds the slot 213 of the hollow-core housing 21, and thus water and moisture cannot intrude into the receiving recess 211 of the hollow-core housing 21 through the slot 213, thereby further ensuring the hermetic seal of the hollow-core housing 21.

In this embodiment, with the hollow-core housing 21 being made of a transparent material, components (such as the circuit board and the antenna) inside the hollow-core housing 21 are visible with the naked eye, rendering it easy to determine whether the components are correctly mounted in place. However, the hollow-core housing 21 is not necessarily made of a transparent material. In another embodiment, the hollow-core housing is made of a non-transparent material.

The electronic devices of the other embodiments are similar to the electronic device of FIG. 1. Thus, descriptions of the embodiments below focus on differences between the electronic devices of the embodiments and the electronic device of FIG. 1 rather than their common or similar technical features.

Figure 5:
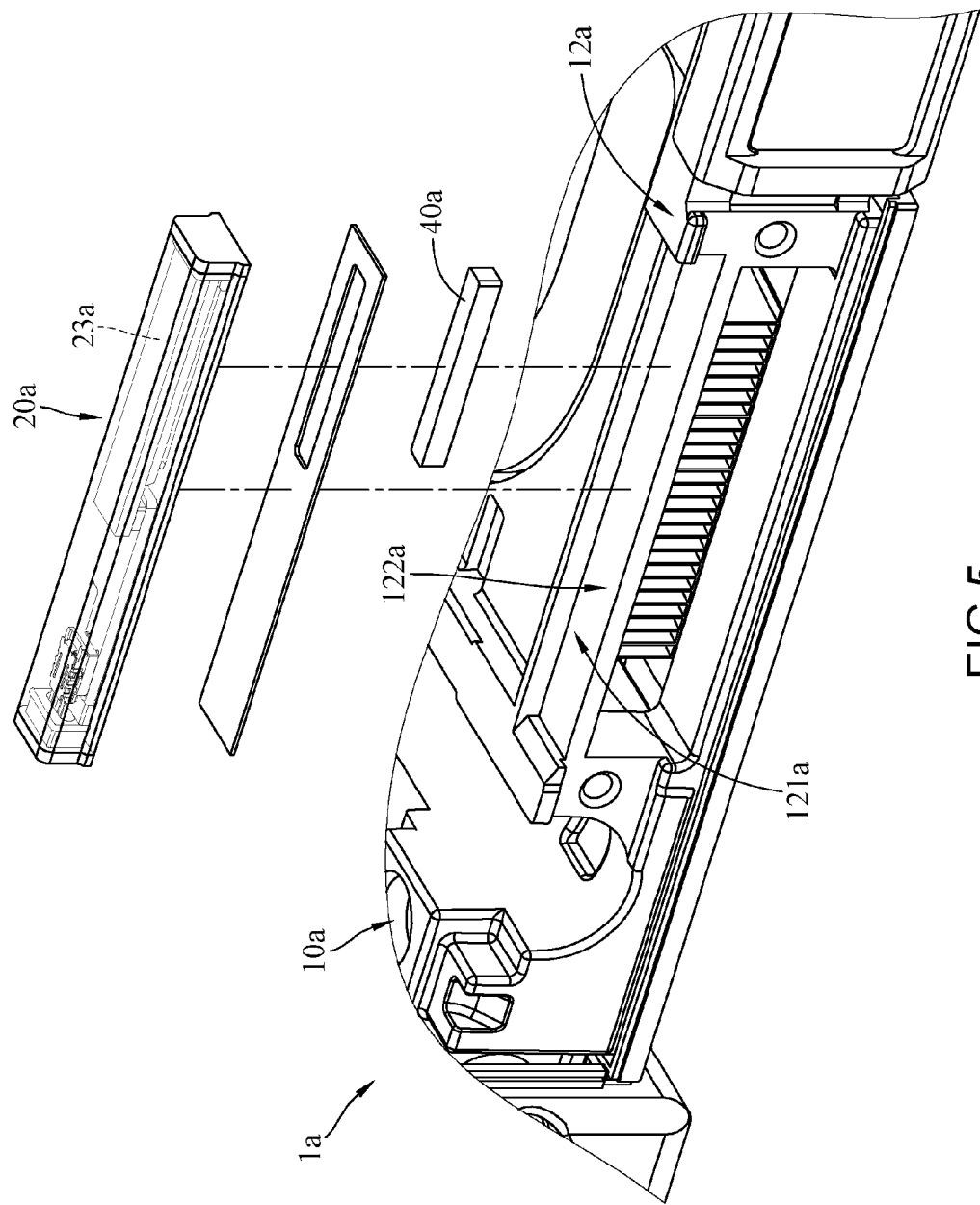
FIG. 5 is an exploded view of an electronic device according to the second embodiment of the present disclosure.

Referring to FIG. 5, there is shown an exploded view of an electronic device according to the second embodiment of the present disclosure.

In this embodiment, the peripheral area 12a of the casing 10a of the electronic device 1a lacks a heat transfer bump, but the electronic device 1a further comprises a heat transferring element 40a. The heat transferring element 40a is disposed on the bottom surface 122a of the mounting recess 121a of the casing 10. One end of the heat transferring element 40a is coupled to the antenna 23a of the antenna assembly 20a, whereas the other end of the heat transferring element 40a is thermally coupled to the casing 10a.

Figure 6:
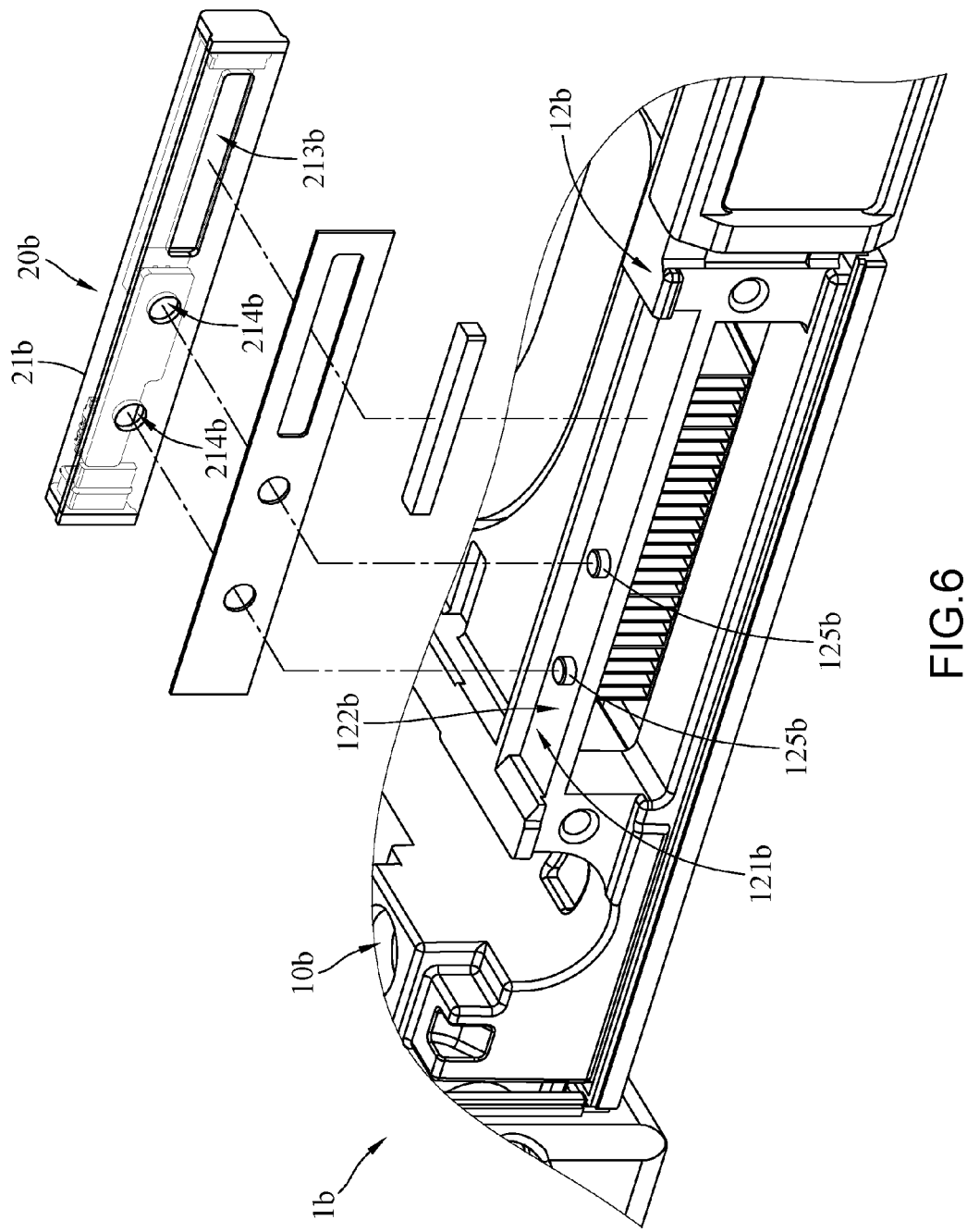
FIG. 6 is an exploded view of an electronic device according to the third embodiment of the present disclosure.

Referring to FIG. 6, there is shown an exploded view of an electronic device according to the third embodiment of the present disclosure.

In this embodiment, the peripheral area 12b of the casing 10b of the electronic device 1b has two positioning posts 125b. The two positioning posts 125b are disposed on the bottom surface 122b of the mounting recess 121b. The hollow-core housing 21b of the antenna assembly 20b further has two positioning holes 214b. The two positioning holes 214b and the slot 213b are located on the same side of the hollow-core housing 21b. The two positioning posts 125*b* are inserted into the two positioning holes 214*b*, respectively, thereby positioning the hollow-core housing 21*b*.

In this embodiment, the positioning posts 125*b* are in the number of two, and the positioning holes 214*b* are in the number of two, but the present disclosure is not limited thereto. In another embodiment, the numbers of the positioning posts and positioning holes are subject to changes as needed. Alternatively, the peripheral area of the casing lacks positioning posts, whereas the hollow-core housing of the antenna assembly lacks positioning holes but is positioned at the peripheral area of the casing with the heat transfer bump 124 shown in FIG. 3.

Figure 7:
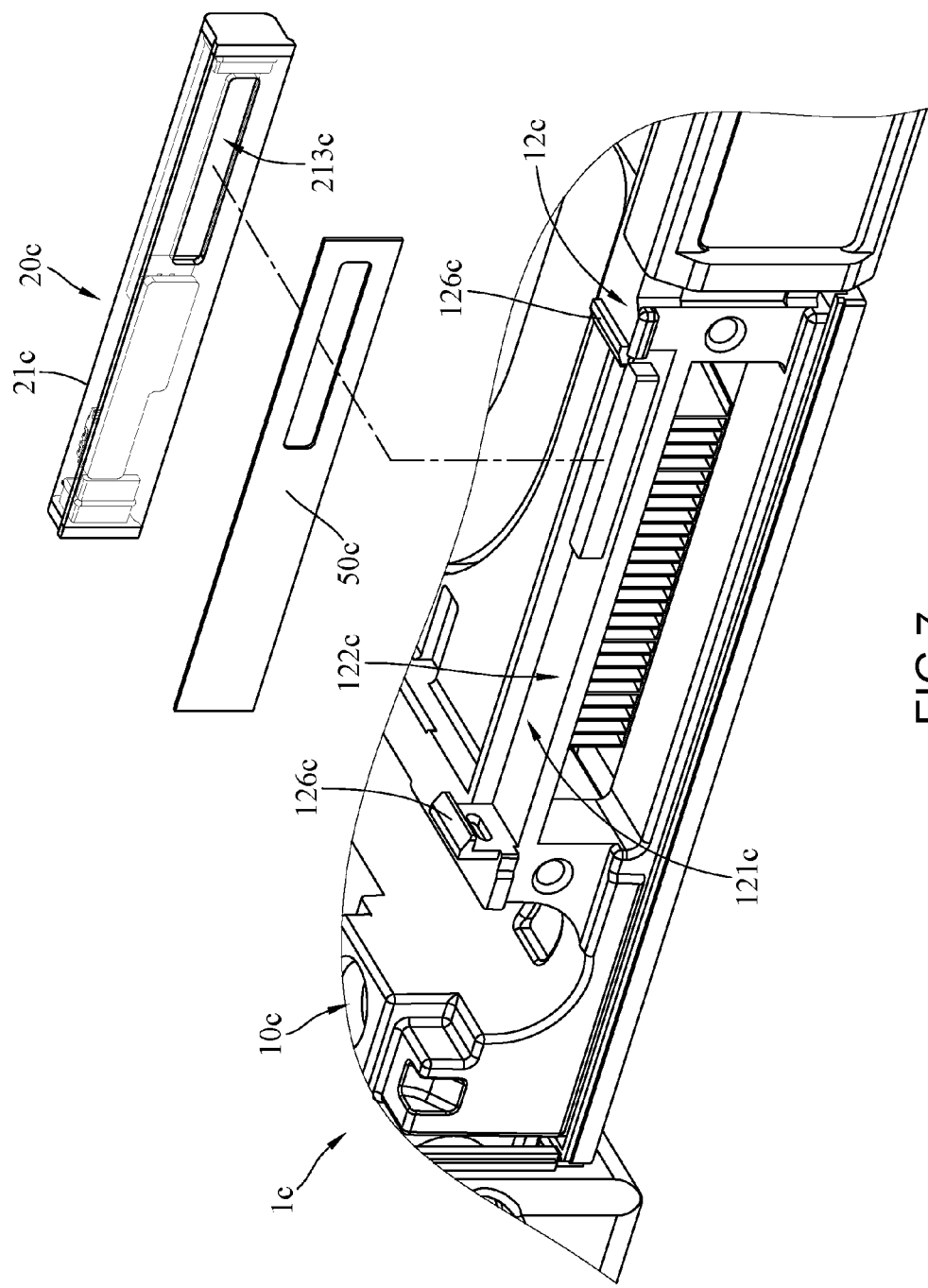
FIG. 7 is an exploded view of an electronic device according to the fourth embodiment of the present disclosure.
Figure 8:
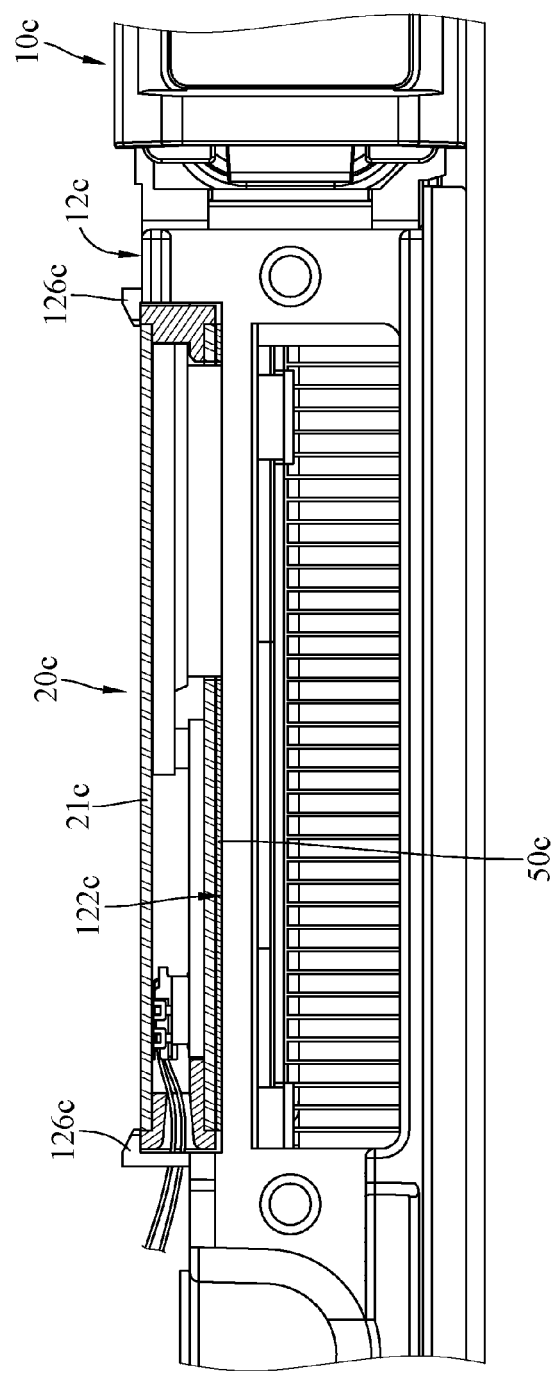
FIG. 8 is a cross-sectional view of the electronic device of FIG. 7.

Refer to FIG. 7 and FIG. 8. FIG. 7 is an exploded view of an electronic device according to the fourth embodiment of the present disclosure. FIG. 8 is a cross-sectional view of the electronic device of FIG. 7.

In this embodiment, the electronic device 1*c* lacks the adhering element but further comprises a third sealing element 50*c*, whereas the antenna assembly 20*c* is fixed to the casing 10*c* by snap-engagement. The peripheral area 12*c* of the casing 10*c* further has two opposing snap-engagement structures 126*c*. The two snap-engagement structures 126*c* are disposed at two opposing ends of the mounting recess 121*c*. The hollow-core housing 21*c* of the antenna assembly 20*c* is fixed to the mounting recess 121*c* of the casing 10*c* through the two snap-engagement structures 126*c*. The third sealing element 50*c* is, for example, made of rubber. The third sealing element 50*c* is clamped between the hollow-core housing 21*c* and the bottom surface 122*c* of the mounting recess 121*c* and surrounds the slot 213*c* of the hollow-core housing 21*c* to prevent intrusion of water and moisture into the hollow-core housing 21*c* through the slot 213*c* and thereby ensure the hermetic seal of the hollow-core housing 21*c*.

In this embodiment, the snap-engagement structures 126*c* are not necessarily in the number of two. In another embodiment, the snap-engagement structure is in the number of one.

Figure 9:
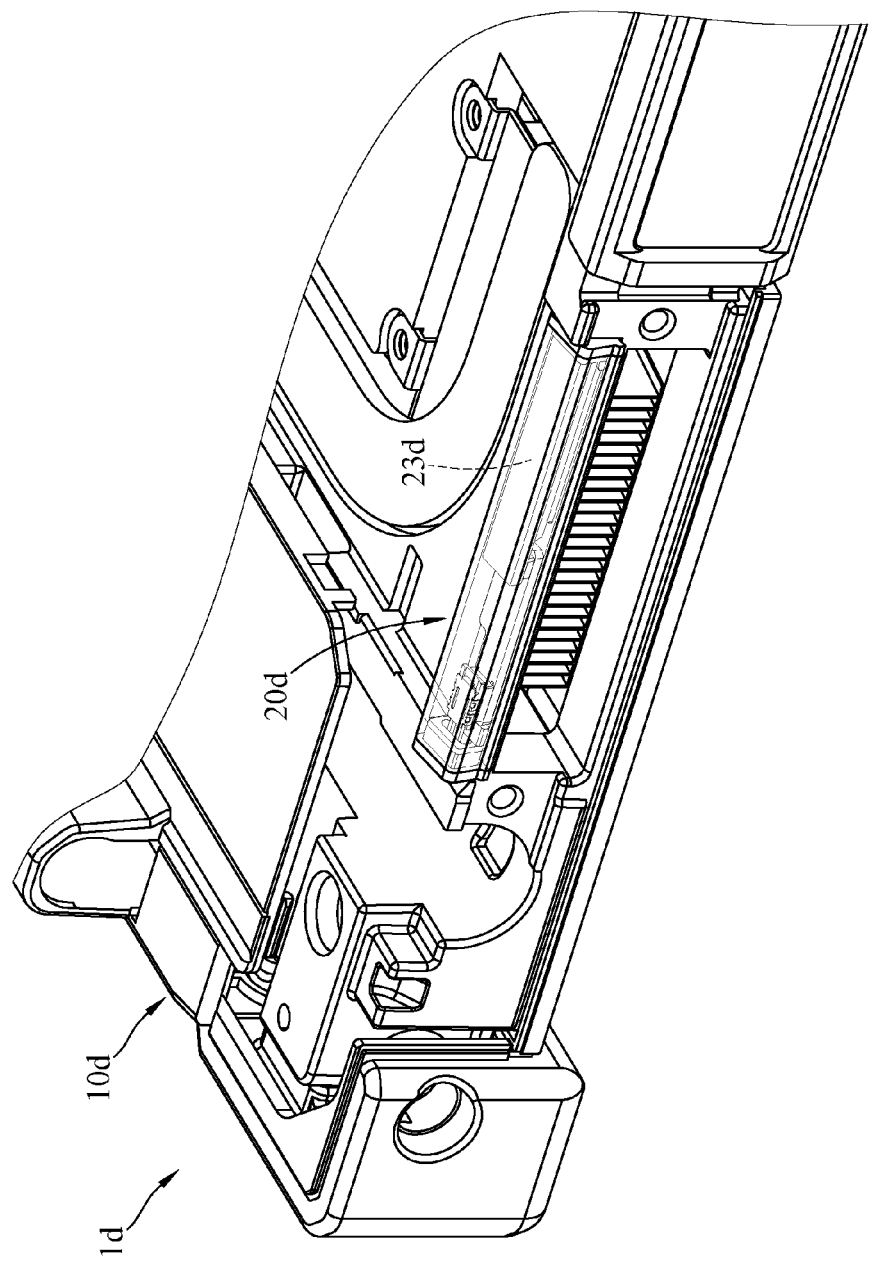
FIG. 9 is a cutaway view of an electronic device according to the fifth embodiment of the present disclosure.
Figure 10:
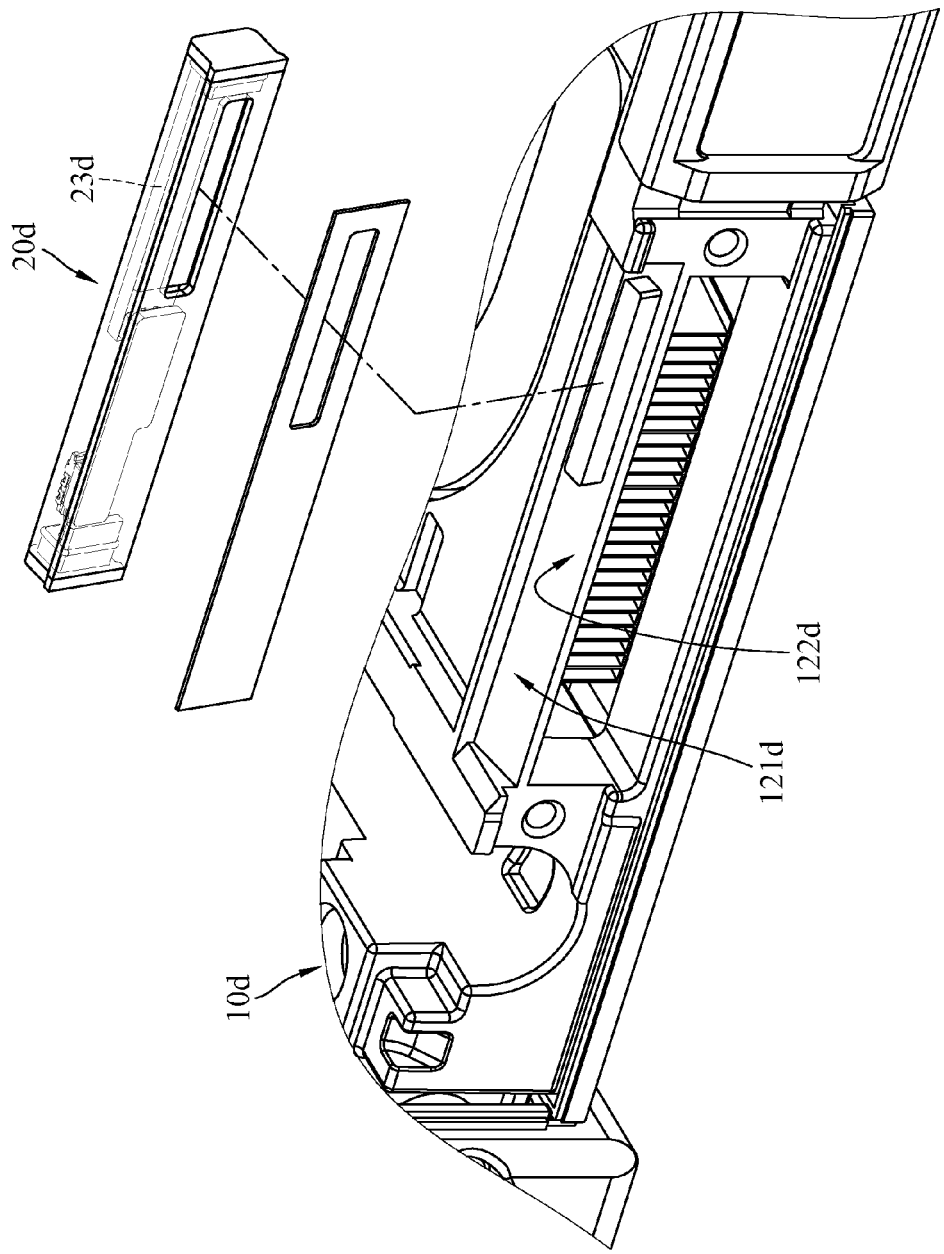
FIG. 10 is an exploded view based on FIG. 9.

Refer to FIG. 9 and FIG. 10. FIG. 9 is a cutaway view of an electronic device according to the fifth embodiment of the present disclosure. FIG. 10 is an exploded view based on FIG. 9.

Regarding the electronic device 1*d* of this embodiment, the bottom surface 122*d* of the mounting recess 121*d* of the casing 10*d* is an oblique surface. Thus, after the antenna assembly 20*d* has been mounted in the mounting recess 121*d*, the signal receiving and sending angle of the antenna 23*d* is different from the signal receiving and sending angle of the antenna 23 of FIG. 1, so as to meet different usage needs.

In the aforesaid embodiment, the casing is not necessarily a housing for the body of a laptop. In another embodiment, the casing is a housing for the screen of a laptop.

Figure 11:
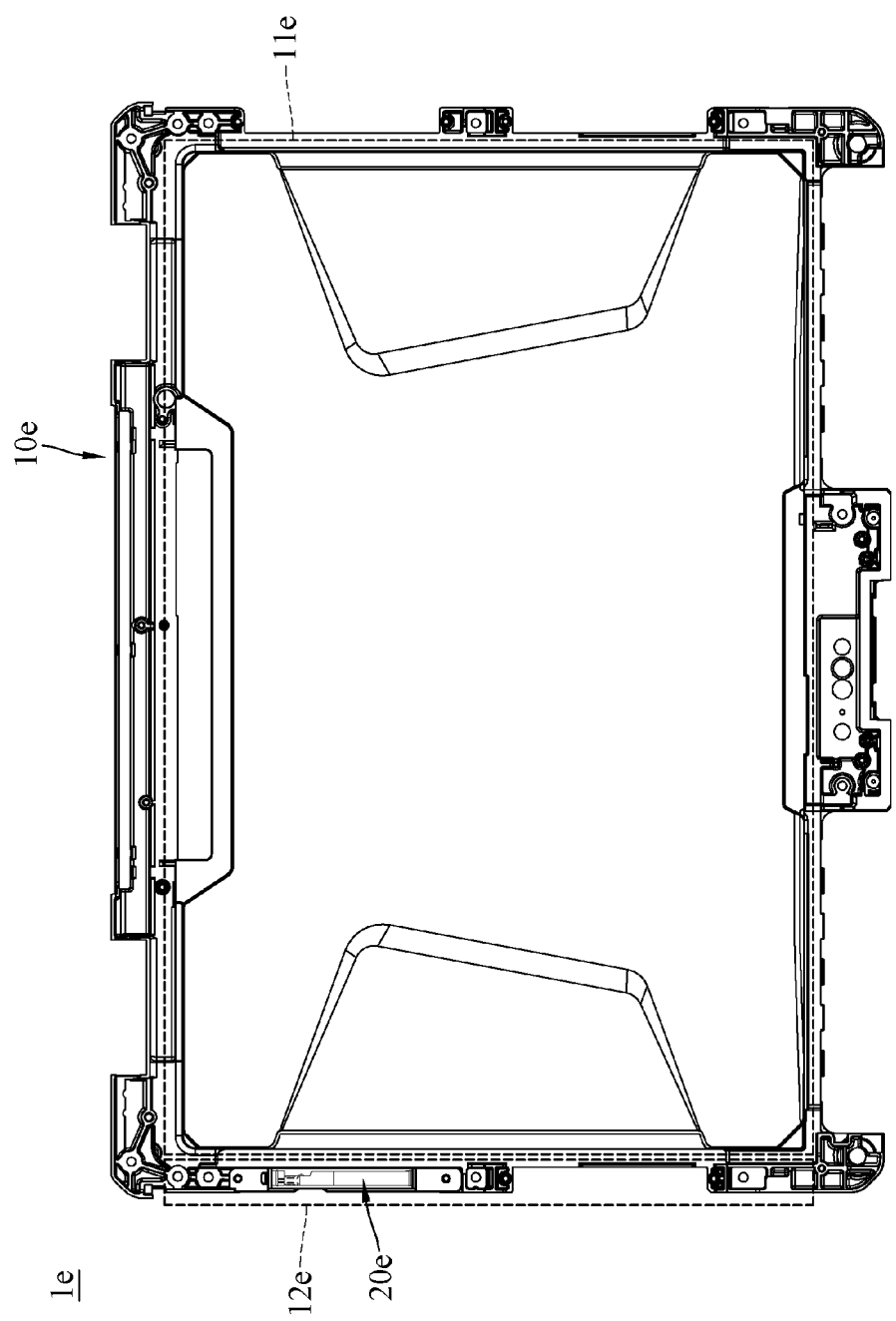
FIG. 11 is a top view of an electronic device according to the sixth embodiment of the present disclosure.
Figure 12:
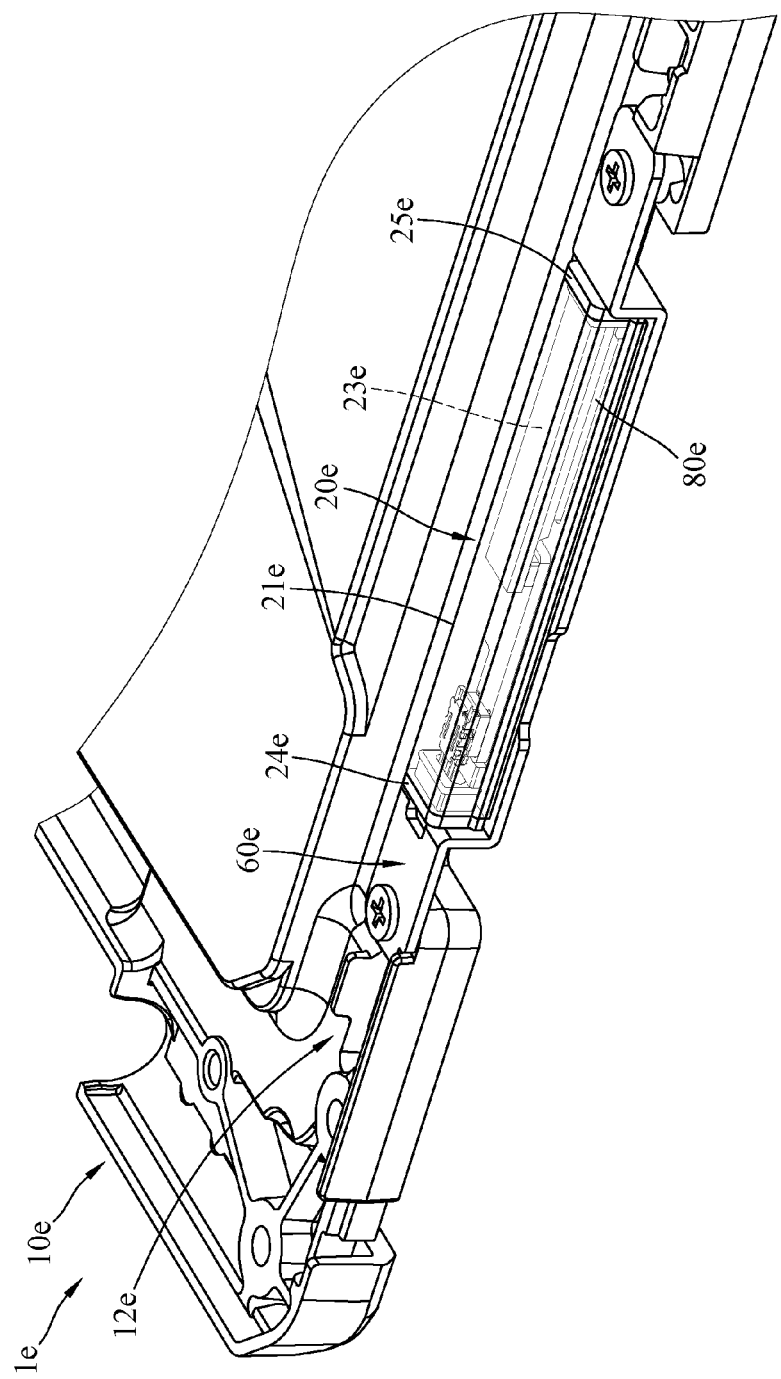
FIG. 12 is a cutaway view based on FIG. 11.
Figure 13:
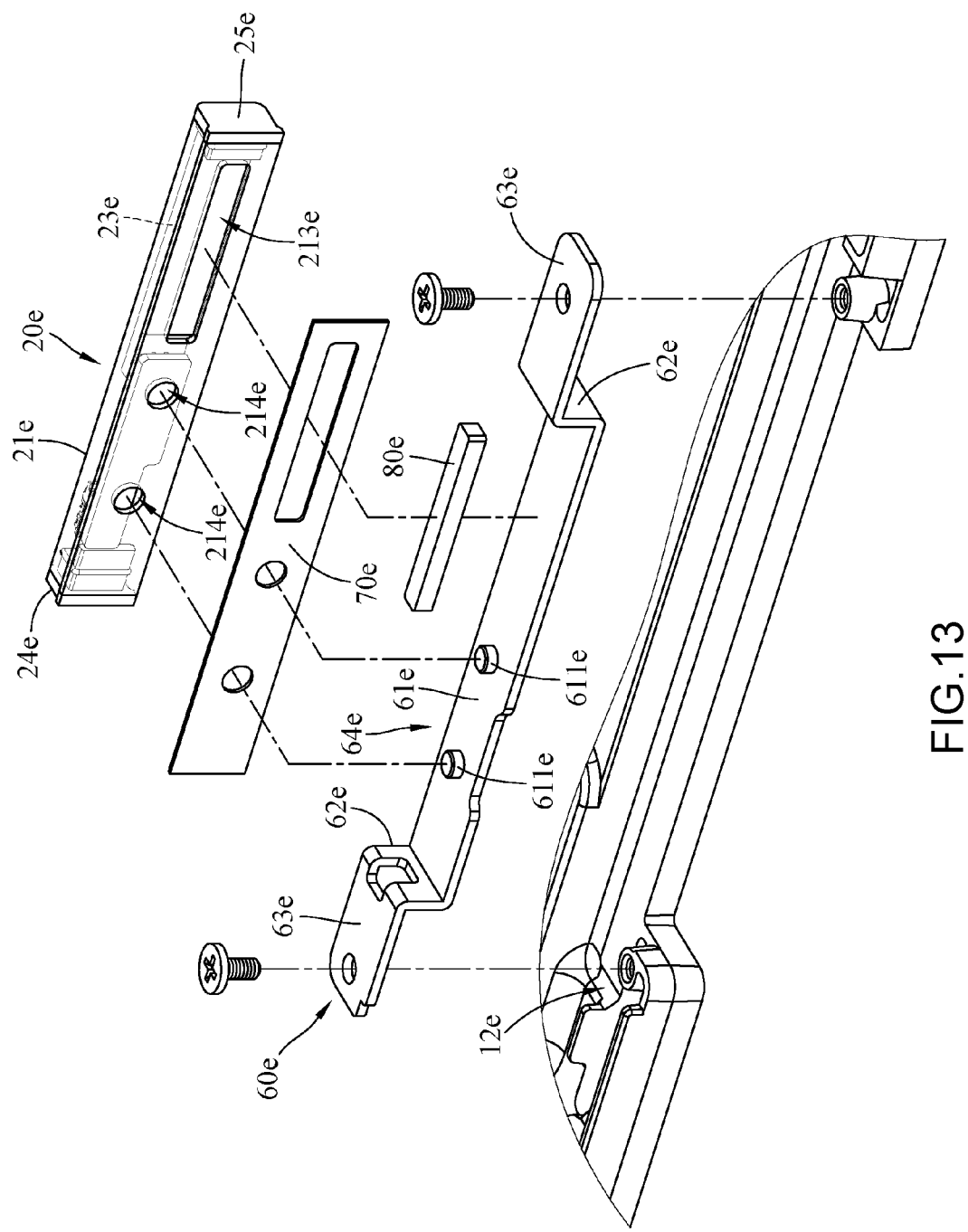
FIG. 13 is an exploded view based on FIG. 12.

Refer to FIG. 11 through FIG. 13. FIG. 11 is a top view of an electronic device according to the sixth embodiment of the present disclosure. FIG. 12 is a cutaway view based on FIG. 11. FIG. 13 is an exploded view based on FIG. 12.

In the electronic device 1*e* of this embodiment, the casing 10*e* is, for example, a housing for the screen of a laptop. The waterproof area 11*e* is, for example, surrounded by a metal plate. The peripheral area 12*e* is defined at the periphery of the waterproof area 11*e*. The peripheral area 12*e* is enclosed by a plastic coating. Thus, the peripheral area 12*e* falls outside an area formed by the surrounding metal plate; hence, not only does the peripheral area 12*e* have worse waterproofing performance than the waterproof area 11*e*, but electronic components in the peripheral area 12*e* are also less susceptible to signal shielding than electronic components in the waterproof area 11*e*. Therefore, the waterproof area 11*e* accommodates electronic components which have to shut out water or have to be protected against electromagnetic interference, such as motherboards, whereas the peripheral area 12*e* accommodates electronic components which either has little waterproofing requirement or has a need to receive and send wireless signals.

The electronic device 1*e* in this embodiment further comprises a mounting unit 60*e*, an adhering element 70*e* and a heat transferring element 80*e*. The mounting unit 60*e* comprises a support plate 61*e*, two erect plates 62*e* and two mounting plates 63*e*. Two opposing ends of the support plate 61*e* are connected to the two mounting plates 63*e* through the two erect plates 62*e*, respectively. The support plate 61*e* and two erect plates 62*e* jointly form a depression 64*e*. Furthermore, the support plate 61*e* has two positioning posts 611*e*. The two positioning posts 611*e* are located within the depression 64*e*.

The hollow-core housing 21*e* of the antenna assembly 20*e* has two positioning holes 214*e*. The two positioning holes 214*e* and the slot 213*e* are located on the same side of the hollow-core housing 21*e*. The adhering element 70*e* is, for example, double-sided tape. The hollow-core housing 21*e* of the antenna assembly 20*e* is mounted at the depression 64*e* and fixed onto the support plate 61*e* through the adhering element 30*e*. The two positioning posts 611*e* are inserted into the two positioning holes 214*e*, respectively, thereby positioning the hollow-core housing 21*e*. The antenna assembly 20*e* is clamped by the two erect plates 62*e* to prevent separation of the first sealing element 24*e* and second sealing element 25*e* mounted at two opposing ends of the hollow-core housing 21*e* from the hollow-core housing 21*e*. The heat transferring element 80*e* is disposed on the support plate 61*e* and at the slot 213*e* of the hollow-core housing 21*e*. One end of the heat transferring element 80*e* is thermally coupled to the antenna 23*e*. The other end of the heat transferring element 80*e* is thermally coupled to the casing 10*e*. The two mounting plates 63*e* of the mounting unit 60*e* are, for example, fixed to the casing 10*e* by screws.

In this embodiment, the positioning posts 611*e* are in the number of two, and the positioning holes 214*e* are in the number of two, but the present disclosure is not limited thereto. In another embodiment, the numbers of the positioning posts and positioning holes are subject to changes as needed.

The numbers of the erect plates 62*e* and mounting plates 63*e* are not restrictive of the present disclosure. In another embodiment, the mounting unit has only one erect plate and one mounting plate which are each connected to one end of the support plate. Given the aforesaid arrangement, one end of the antenna assembly abuts against the erect plate, and the other end of the antenna assembly abuts against a dam of the casing.

Furthermore, in this embodiment, the adhering element 70*e* is optional. In another embodiment, the adhering element is replaced by a sealing element (for example, the third sealing element 50*c* shown in FIG. 7). Given the aforesaid arrangement, the antenna assembly is fixed to the mounting unit through the snap-engagement structures (for example, the snap-engagement structures shown in FIG. 7), whereas the third sealing element is clamped by and between the hollow-core housing and the support plate, thereby ensuring the hermetical seal of the hollow-core housing.

Figure 14:
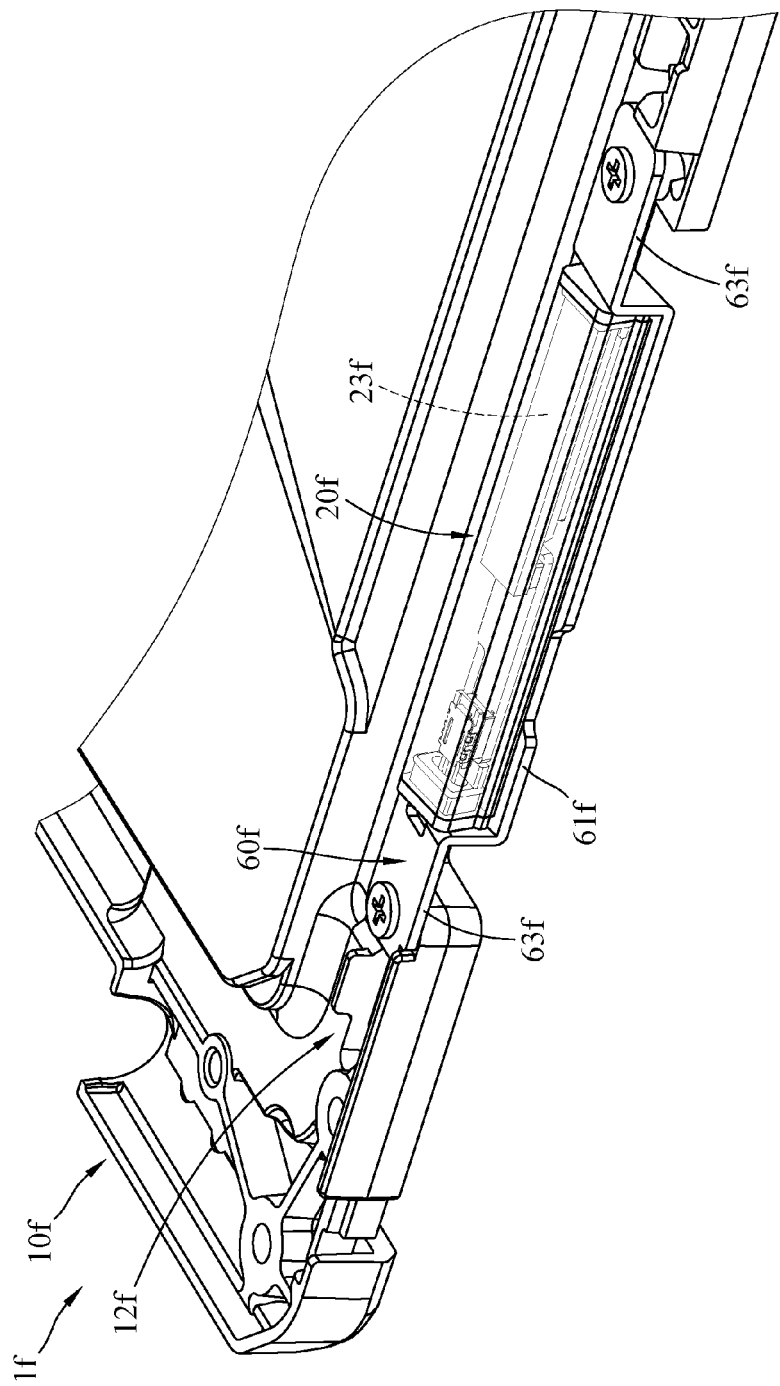
FIG. 14 is a cutaway view of an electronic device according to the seventh embodiment of the present disclosure.
Figure 15:
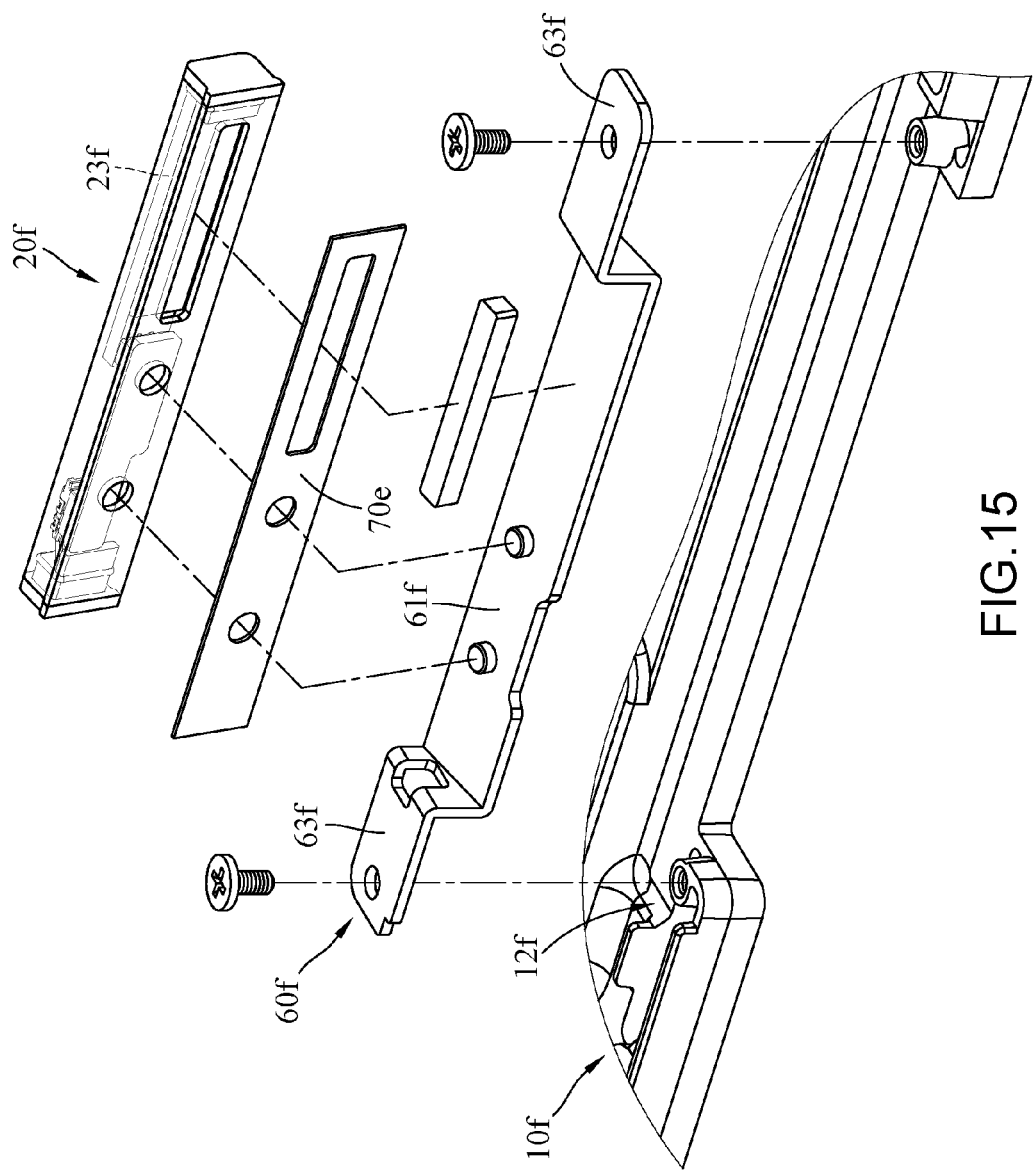
FIG. 15 is an exploded view based on FIG. 14.

Refer to FIG. 14 and FIG. 15. FIG. 14 is a cutaway view of an electronic device according to the seventh embodiment of the present disclosure. FIG. 15 is an exploded view based on FIG. 14.

Regarding the electronic device 1f of this embodiment, the support plate 61f is not parallel to the two mounting plates 63f. Thus, after the mounting unit 60f has been mounted at the peripheral area 12f of the casing 10f, the signal receiving and sending angle of the antenna 23f of the antenna assembly 20f is different from the signal receiving and sending angle of the antenna 23e of FIG. 10, so as to meet different usage needs.

Each of the casings of FIG. 11 and FIG. 14 is not necessarily a housing for the screen of a laptop. In another embodiment, the casing is a housing for the body of a laptop.

Regarding the electronic device and antenna assembly provided according to the aforesaid embodiments, the two opposing openings of the hollow-core housing are hermetically sealed by the first sealing element and second sealing element, respectively, to prevent intrusion of water and moisture into the receiving recess of the hollow-core housing through the two openings, thereby ensuring the hermetic seal of the hollow-core housing. Therefore, even though the antenna assembly is disposed at the peripheral area defined at the periphery of the waterproof area of the casing, water and moisture cannot intrude into the hollow-core housing, thereby lowering the chance that the antenna and circuit board in the hollow-core housing will get damaged.

Although the present disclosure is disclosed above by preferred embodiments, the preferred embodiments are not restrictive of the present disclosure. Changes and modifications made by persons skilled in the art to the preferred embodiments without departing from the spirit of the present disclosure must be deemed falling within the scope of the present disclosure. Accordingly, the legal protection for the present disclosure should be defined by the appended claims.

What is claimed is:

1. An electronic device, comprising:
   a casing having a waterproof area and a peripheral area, the peripheral area being defined at a periphery of the waterproof area; and
   an antenna assembly disposed at the peripheral area, the antenna assembly comprising:
   a hollow-core housing having a receiving recess and two openings, the two openings being in communication with two opposing ends of the receiving recess;
   a circuit board disposed in the receiving recess;
   an antenna disposed in the receiving recess and electrically connected to the circuit board; and
   a first sealing element and a second sealing element, the first sealing element having a wiring aperture, wherein:
      the first sealing element and the second sealing element hermetically seal the two openings of the hollow-core housing, respectively,
      the hollow-core housing has a slot, and
      the casing has a heat transfer bump disposed in the slot and thermally coupled to the antenna.

2. The electronic device of claim 1, wherein the hollow-core housing has at least one positioning hole, and the casing has at least one positioning post inserted into the at least one positioning hole.

3. The electronic device of claim 1, wherein the hollow-core housing is made of a transparent material.

4. The electronic device of claim 1, wherein the circuit board has a power connector, and the power connector is electrically connected to the antenna.

5. The electronic device of claim 1, further comprising an adhering element whereby the antenna assembly adheres to the casing.

6. The electronic device of claim 5, wherein the casing has a mounting recess, allowing the antenna assembly to be mounted in the mounting recess and clamped by and between two opposing lateral surfaces of the mounting recess.

7. The electronic device of claim 1, further comprising a third sealing element clamped by and between the hollow-core housing and the casing.

8. The electronic device of claim 7, wherein the casing has a snap-engagement structure, and the snap-engagement structure is snap-engaged with the hollow-core housing.

9. The electronic device of claim 1, further comprising a mounting unit, the mounting unit comprising a support plate and at least one mounting plate connected to the support plate, allowing the antenna assembly to be stacked on the support plate and mounted at the casing through the at least one mounting plate.

10. The electronic device of claim 9, wherein the at least one mounting plate is two mounting plates, and the mounting unit further comprises two erect plates whereby two opposing ends of the support plate are connected to the two mounting plates, respectively, wherein the support plate and the two erect plates jointly form a depression, allowing the antenna assembly to be mounted at the depression and clamped by the two erect plates.

11. The electronic device of claim 9, wherein the support plate is not parallel to the at least one mounting plate.

12. The electronic device of claim 9, wherein the hollow-core housing has at least one positioning hole, and the support plate has at least one positioning post inserted into the at least one positioning hole.

13. An electronic device, comprising:
   a casing having a waterproof area and a peripheral area, the peripheral area being defined at a periphery of the waterproof area;
   an antenna assembly disposed at the peripheral area, the antenna assembly comprising:
   a hollow-core housing having a receiving recess and two openings, the two openings being in communication with two opposing ends of the receiving recess;
   a circuit board disposed in the receiving recess;
   an antenna disposed in the receiving recess and electrically connected to the circuit board; and
   a first sealing element and a second sealing element, the first sealing element having a wiring aperture, wherein the first sealing element and the second sealing element hermetically seal the two openings of the hollow-core housing, respectively; and
   a heat transferring element disposed in a slot of the hollow-core housing, the heat transferring element having an end thermally coupled to the antenna and having another end thermally coupled to the casing.

14. The electronic device of claim 13, further comprising a mounting unit, the mounting unit comprising a support plate and at least one mounting plate connected to the support plate, allowing the antenna assembly to be stacked on the support plate and mounted at the casing through the at least one mounting plate.

15. The electronic device of claim 14, wherein the hollow-core housing has at least one positioning hole, and the support plate has at least one positioning post inserted into the at least one positioning hole.

16. The electronic device of claim 13, wherein the hollow-core housing has at least one positioning hole, and the casing has at least one positioning post inserted into the at least one positioning hole.

17. The electronic device of claim 13, further comprising an adhering element whereby the antenna assembly adheres to the casing.

18. An electronic device, comprising:
  a casing having a waterproof area and a peripheral area, the peripheral area being defined at a periphery of the waterproof area;
  an antenna assembly disposed at the peripheral area, the antenna assembly comprising:
    a hollow-core housing having a receiving recess and two openings, the two openings being in communication with two opposing ends of the receiving recess;
    a circuit board disposed in the receiving recess;
    an antenna disposed in the receiving recess and electrically connected to the circuit board; and
    a first sealing element and a second sealing element, the first sealing element having a wiring aperture, wherein the first sealing element and the second sealing element hermetically seal the two openings of the hollow-core housing, respectively; and
  a mounting unit, the mounting unit comprising a support plate and at least one mounting plate connected to the support plate, allowing the antenna assembly to be stacked on the support plate and mounted at the casing through the at least one mounting plate, wherein the hollow-core housing has at least one positioning hole, and the support plate has at least one positioning post inserted into the at least one positioning hole.

19. The electronic device of claim 18, wherein the at least one mounting plate is two mounting plates, and the mounting unit further comprises two erect plates whereby two opposing ends of the support plate are connected to the two mounting plates, respectively, wherein the support plate and the two erect plates jointly form a depression, allowing the antenna assembly to be mounted at the depression and clamped by the two erect plates.

20. The electronic device of claim 18, wherein the hollow-core housing has at least one positioning hole, and the casing has at least one positioning post inserted into the at least one positioning hole.

* * * * *